(12) United States Patent
Matsunaga

(10) Patent No.: US 6,625,799 B2
(45) Date of Patent: Sep. 23, 2003

(54) TECHNOLOGY MAPPING METHOD AND STORAGE MEDIUM

(75) Inventor: Yusuke Matsunaga, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 48 days.

(21) Appl. No.: 09/739,746

(22) Filed: Dec. 20, 2000

(65) Prior Publication Data

US 2001/0013113 A1 Aug. 9, 2001

Related U.S. Application Data

(63) Continuation of application No. PCT/JP99/01840, filed on Apr. 7, 1999.

(30) Foreign Application Priority Data

Aug. 6, 1998 (JP) ............................................. 10-223040

(51) Int. Cl.[7] .............................................. G06F 17/50
(52) U.S. Cl. ............................. 716/18; 716/16; 716/17
(58) Field of Search ............................ 716/6, 7, 16–18; 703/19; 326/38, 41

(56) References Cited

U.S. PATENT DOCUMENTS 5,610,829 A * 3/1997 Trimberger .................. 716/16
5,787,010 A * 7/1998 Schaefer et al. ............... 716/7

FOREIGN PATENT DOCUMENTS

| JP | 4-69773 | 3/1992 |
| JP | 4-127275 | 4/1992 |
| JP | 5-61937 | 3/1993 |
| JP | 6-149930 | 5/1994 |

* cited by examiner

Primary Examiner—Vuthe Siek
Assistant Examiner—Naum Levin
(74) Attorney, Agent, or Firm—Staas & Halsey LLP

(57) ABSTRACT

A technology mapping method automatically converts a logic circuit, which does not depend on a specific circuit technology, into a circuit which uses a specific cell library by controlling a computer to optimize a pattern which is to be subjected to a matching process, based on an inclusion relationship of structures of patterns with respect to each cell.

12 Claims, 16 Drawing Sheets

FIG.1
(a) 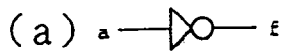
(b) 
(c) 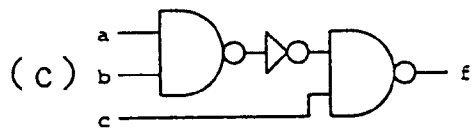
(d) 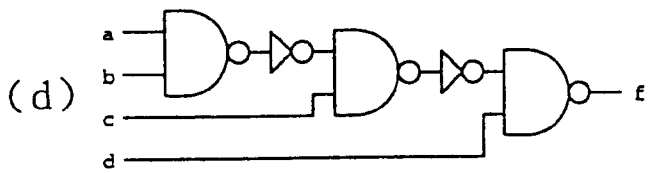
(e) 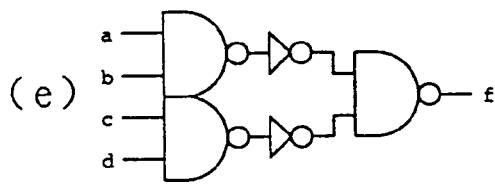
(f) 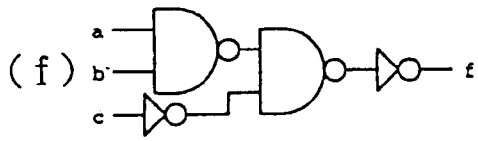
(g) 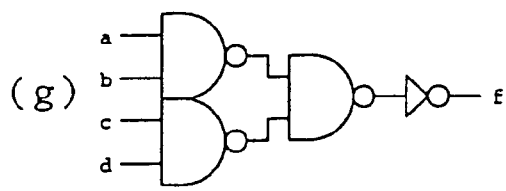
(h) 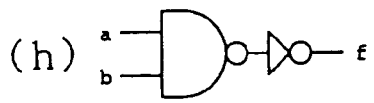

FIG. 15

| PATTERN NAME | REPRESENTATIVE PATTERN | CONVERSION MAP |
|---|---|---|
| NOR2 | NAND2 | a→*a, b→*b, f→*f |
| AND2 | NAND2 | a→*a, b→*b, f→f |
| OR2 | NAND2 | a→a, b→b, f→*f |
| NOR3 | NAND3 | a→*a, b→*b, c→*c, f→*f |
| NOR4 | NAND4 | a→*a, b→*b, c→*c, d→*d, f→*f |
| OAI21 | AOI21 | a→*a, b→*b, c→*c, f→*f |
| OAI22 | AOI22 | a→*a, b→*b, c→*c, d→*d, f→*f |

FIG. 16

| REPRESENTATIVE PATTERN | SIMILAR PATTERN | INCLUDING PATTERN | INCLUDED PATTERN |
|---|---|---|---|
| NAND2 | NOR2, AND2, OR2 | — | NAND3, OAI21 |
| NAND3 | NOR3 | NAND2 | NAND4 |
| NAND4 | NOR4 | NAND3 | — |
| OAI21 | AOI21 | NAND2 | OAI22 |
| OAI22 | AOI22 | OAI21 | — |

FIG.17
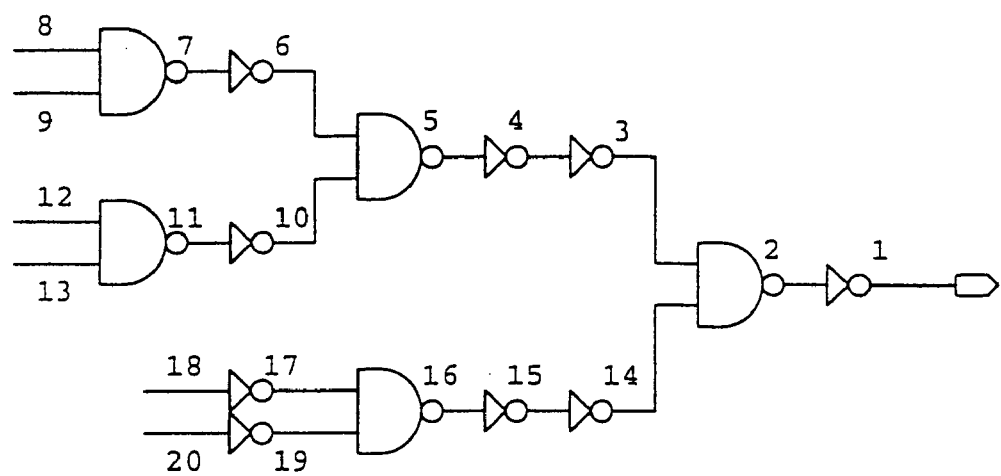
(a)
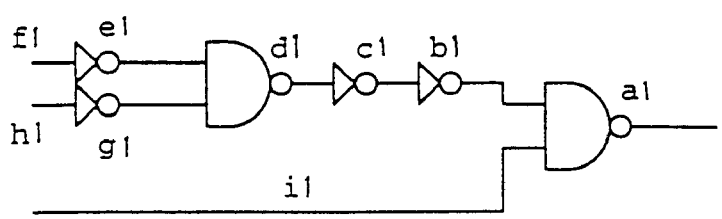
(b)

FIG. 18

| CELL LIBRARY | NO. OF PATTERNS | NO. OF REPRESENTATIVE PATTERNS | PROCESSING TIME (SECONDS) ||
|---|---|---|---|---|
| | | | CONVENTIONAL | EMBODIMENT |
| A | 108 | 27 | 20.14 | 11.86 |
| B | 395 | 352 | 41.59 | 9.72 |
| C | 624 | 312 | 59.44 | 9.98 |
| D | 3502 | 1751 | 330.68 | 23.20 |

TECHNOLOGY MAPPING METHOD AND STORAGE MEDIUM

This application is a continuing application, filed under 35 U.S.C. §111(a), of International Application PCT/JP99/01840, filed Apr. 7, 1999, it being further noted that priority is based upon Japanese Patent Application 10-223040, filed Aug. 6, 1998.

BACKGROUND OF THE INVENTION

The present invention generally relates to technology mapping methods and storage media, and more particularly to a technology mapping method for automatically converting a logic circuit which does not depend on a specific circuit technology into a circuit which uses a specific cell library, and to a computer-readable storage medium which stores a program for causing a computer to carry out a technology mapping process using such a technology mapping method.

When designing a logic circuit, it is necessary to take into consideration various restricting conditions such as the circuit area, delay time and power consumption, in addition to the logic specifications. For this reason, the logic combining process which automatically designs the logic circuit normally employs a method which divides the process into a technology-independent combining process which is independent of the circuit technology and a technology-dependent combining process which is dependent on the circuit technology, and carries out the combining process according to respective partial targets.

The technology-dependent combining process is also called technology mapping, and is carried out when converting a technology-independent logic circuit into an actual circuit. Presently, the popularly used technology mapping employs a technique called a cell based design technique. When realizing a circuit by this cell based design technique, logic element parts which are prepared in advance, that is, cells, are combined to form the logic circuit.

BACKGROUND ART

The technology mapping which is conventionally reduced to practice is based on an algorithm called DAGON proposed in Kurt Keutzer, "DAGON: Technology Binding and Local Optimization", Proc. 24th ACM/IEEE Design Automation Conference, pp. 341–247, June 1987. This proposed algorithm called DAGON temporarily converts a target circuit which is to be designed into a circuit using basic cells such as 2-input NAND gates and NOT gates, and generates the actual circuit by assigning larger cells with respect to partial circuits which are made up of the NAND gates and the NOT gates.

A description will be given of an example of the design using the DAGON algorithm. First, with respect to each cell of a cell library, patterns made up of one or more 2-input NAND gates and/or one or more NOT gates and describing logical functions are prepared in advance. The decomposition of the cell is not uniquely determined, and various different decomposition patterns are conceivable. For this reason, all of the decomposition patterns are considered for each cell.

FIGS. 1 and 2 are diagrams showing examples of cells of the cell library and decomposition patterns of the cells. In FIG. 1, (a) shows a decomposition pattern of a cell NOT, (b) shows a decomposition pattern of a cell NAND2, (c) shows a decomposition pattern of a NAND3, (d) shows a decomposition pattern of a cell NAND4, (e) shows a decomposition pattern of the NAND4, (f) shows a decomposition pattern of a cell AOI21, (g) shows a decomposition pattern of a cell AOI22, and (h) shows a decomposition pattern of a cell AND2. In addition, in FIG. 2, (a) shows a decomposition pattern of a cell NOR2, (b) shows a decomposition pattern of a cell NOR3, (c) shows a decomposition pattern of a cell NOR4, (d) shows a decomposition pattern of the cell NOR4, (e) shows a decomposition pattern of a cell OAI21, (f) shows a decomposition pattern of a cell OAI22, and (g) shows a decomposition pattern of a cell AOR2. In FIG. 1, the cell NAND4 has two kinds of decomposition patterns as shown in (d) and (e). In FIG. 2, the cell NOR4 has two kinds of decomposition patterns as shown in (c) and (d).

If it is assumed for the sake of convenience that a target technology-independent logic circuit which is to be designed is formed by virtual AND gates, OR gates and NOT gates, the AND gate can be realized by use of 2-input NAND gates and NOT gates as shown in FIG. 3(a), and the OR gate can be realized by use of 2-input NAND gates and NOT gates as shown in FIG. 3(b). Accordingly, it is possible to easily convert an initial circuit into a circuit consisting solely of the 2-input NAND gates and the NOR gates. In this case, a plurality of decomposition patterns are conceivable, but only one decomposition pattern is normally considered since it is difficult to consider all of the decomposition patterns.

FIG. 4 shows an example of the initial circuit which is decomposed in the above described manner. With respect to the initial circuit shown in FIG. 4, it is possible to assign partial circuits as shown in FIG. 5. In FIG. 5, each partial circuit surrounded by a bold solid line is assigned with respect to one cell. However, such an assignment of the partial circuits with respect to the cells is not uniquely determined, and for example, it is possible to assign partial circuits as shown in FIG. 6 with respect to the initial circuit shown in FIG. 4. In FIG. 6, each partial circuit surrounded by a bold solid line is assigned with respect to one cell.

When assigning the partial circuits with respect to the cells, the technology mapping process selects a most desirable assignment by taking into consideration the restricting conditions and the target functions such as the circuit area, delay time and power consumption. Accordingly, the technology mapping process requires two stages of processes, namely, a matching process and a covering process. The matching process lists the cells which match the partial circuits of the initial circuit. In addition, the covering process generates the actual circuit by combining the matching cells. In this case, a match refers to a combination of the partial circuit surrounded by the bold solid line and the cell indicated beside the partial circuit in FIGS. 5 and 6. In the matching process, all possible matches are listed regardless of whether or not the match is obtained as a result.

With respect to the matching process, an algorithm called graph matching is proposed in R. L. Rudell, "Logic Synthesis For VLSI Design", PhD Thesis, UCB/ERL M89/49, 1989.

FIG. 7 is a flow chart showing a typical matching process. In FIG. 7, a step S1 decides whether or not a non-tested node exists in the initial circuit, and the process ends if the decision result in the step S1 is NO. On the other hand, if the decision result in the step S1 is YES, a step S2 obtains one node and denotes this node by v. A step S3 decides whether or not a non-tested pattern exists, and the process returns to the step S1 if the decision result in the step S3 is NO. If the decision result in the step S3 is YES, a step S4 obtains one pattern and denotes this pattern by p. A step S5 obtains a match with respect to the pattern p at the node v, and the process returns to the step S3. The graph matching referred above is used in the process of the step S5.

Accordingly, when testing the matching of all of the patterns shown in FIGS. 1 and 2 with respect to an initial circuit shown in FIG. 17(a) which will be described later, the conventional matching process must successively carry out the matching with respect to all of the patterns with respect to all nodes 1, 2, 3, . . . of the initial circuit.

For the sake of convenience, a description will be given of a case where the matching of only one pattern is checked with respect to the initial circuit shown in FIG. 17(a) by the matching process shown in FIG. 7. In this case, a check is made to determine whether or not a pattern OAI21 shown in FIG. 17(b) matches with respect to each node of the initial circuit shown in FIG. 17(a). In FIG. 17(b), a1 through h1 indicate both nodes and corresponding input/output signal names, and these node names are unrelated to the node names shown in FIGS. 1 and 2.

(1) First, a check is made to determine whether or not a match having the node 1 as a root exists. In this case, the node 1 is an inverter, but the node a1 is a 2-input NAND gate, and no match exists.

(2) Next, a check is made to determine whether or not a match having a node as a root exists. In this case, both the node 2 and the node a1 are 2-input NAND gates, and the match exists.

There are two inputs to the 2-input NAND gate, and a check is first made to determine whether or not a node 3 and the node b1 match. In this case, both the node 3 and the node b1 are inverters, and the match exists.

Similarly, both a node 4 and the node c1 are inverters and a match exists, and both a node 5 and the node d1 are inverters and a match exists.

The two inputs e1 and g1 of the node d1 respectively match nodes 6 and 10, and the two inputs f1 and h1 of the nodes e1 and g1 respectively match nodes 7 and 11. Nodes 7 and 11 become termination nodes.

When a check is made to determine whether the remaining input i1 of the node a1 matches a node 14, a match exists unconditionally since the node i1 is a termination node.

As described above, all portions of the pattern OAI21 match, and the matching of the entire pattern is successful in this case. The termination nodes are determined so that the nodes f1 and 7 correspond, the nodes h1 and 11 correspond, and the nodes i1 and 14 correspond.

When a combination of the nodes b1 and 14 is tested with respect to the inputs of the node a1, a match exists because both the nodes b1 and 14 are inverters.

In addition, when a combination of the nodes c1 and 15 is tested with respect to the inputs of the node b1, a match exists because both the nodes c1 and 15 are inverters. Similarly, when a combination of the nodes d1 and 16 is tested, a match exists because both the nodes d1 and 16 are inverters.

The inputs e1 and g1 of the node d1 respectively match nodes 17 and 19, and the inputs f1 and h1 of the nodes d1 and e1 respectively match nodes 18 and 20. The nodes 18 and 20 become termination nodes.

Since the remaining input i1 of the node a1 matches the node 3, the node 3 also becomes a termination node.

As a result, another matching is obtained, and the correspondences of the termination nodes are such that the nodes f1 and 18 correspond, the nodes h1 and 20 correspond, and the nodes i1 and 3 correspond.

(3) Because the nodes 3 and 4 are inverters, no match exists with respect to the node a1.

(4) When the matching of the nodes 5 and a1 is tested, a match exists between the nodes 5 and a1 in this case.

When the matching of the input of the node 5 and the input of the node a1 is checked, a match exists between the nodes 6 and b1 because both the nodes 6 and b1 are inverters.

However, no match exists between the nodes 7 and c1, and as a result, it is concluded that no match exists between the nodes 6 and b1.

When the matching between the nodes 6 and i1 is checked, a match exists between the nodes 6 and i1.

When the matching of the remaining inputs of the node 5 is checked, a match exists between the nodes 10 and b1 because both the nodes 10 and b1 are inverters.

However, no match exists between the nodes 11 and c1, and as a result, it is concluded that no match exists between the nodes 10 and b1.

Because no match exists with respect to the inputs of the node 5, it is concluded that no match exists between the nodes 5 and a1.

The pattern matching is carried out with respect to all of the nodes of the initial circuit in the manner described above. Actually, the matching of not only one pattern with respect to the initial circuit is checked, but the matching of a plurality of patterns with respect to the initial circuit is checked.

In the covering process which is carried out in a stage next to the matching process, the matches obtained by the matching process are used as parts, and a combination of the matches is generated to cover the entire circuit as if tiles were being used to cover the entire circuit. In this state, an algorithm for minimizing the circuit area, an algorithm for minimizing the delay time and the like are proposed in R. L. Rudell, "Logic Synthesis For VLSI Design", PhD Thesis, UCB/ERL M89/49, 1989.

In the actual program which carries out the technology mapping process, the matching process and the covering process described above are not clearly separated, and the covering process is carried out while obtaining the match by the matching process. But for the sake of convenience, the matching process and the covering process will be described separately, because attention is being drawn particularly to the matching process.

On the other hand, a technique called inverter chain heuristic has been proposed. According to the inverter chain heuristic technique, two inverters are inserted in series into a connecting line having no inverter, with respect to the initial circuit. As shown in FIG. 8, it is possible to find matches which could not be obtained by other techniques, and there is a possibility that a satisfactory circuit can be synthesized using the inverter chain heuristic technique. In FIG. 8, an inverter pair which is not surrounded by a bold solid line is removed from the final circuit.

As described above, there are cases where a plurality of patterns are required with respect to one cell, and in addition, there is a tendency for the number of required patterns to increase as the number of input signals of the cell increases. In a worst case, the required number of patterns is proportional to an exponential power of the number of input signals to the cell. In such a case, the cells of the cell library become complex and large scale, and there is a problem in that it takes an extremely long time to list all of the patterns and to search the matches with respect to all of the patterns.

Recently, there is a tendency for the number itself of the cells usable in the cell library to increase. For this reason, the required memory capacity and calculation time both increase considerably if the conventional simple matching algorithm is used, and there is a problem in that the processing speed deteriorates or the process itself becomes impossible to carry out.

SUMMARY OF THE INVENTION

Accordingly, it is a general object of the present invention to provide a novel and useful technology mapping method and storage medium, in which the problems described above are eliminated.

Another and more specific object of the present invention is to provide a technology mapping method and storage medium, which can carry out a matching process efficiently with respect to a cell library which has a tendency to become large scale and complex.

Still another object of the present invention is to provide a technology mapping method which automatically converts a logic circuit which does not depend on a specific circuit technology into a circuit which uses a specific cell library, using a computer, comprising an optimizing step of optimizing a pattern which is to be subjected to a matching process based on an inclusion relationship of structures of patterns with respect to each cell. According to the present invention, it is possible to carry out the matching process efficiently with respect to the cell library which has the tendency of becoming large scale and complex.

The optimizing step may omit the matching process with respect to a pattern which includes a pattern for which no match is obtained.

The optimizing step may define similar patterns which only differ by inverters provided at input and output sides thereof, and determine one representative pattern with respect to each group of the similar patterns, and the technology mapping method may further comprise a matching step of carrying out the matching process only with respect to the representative pattern.

The matching step may obtain a match with respect to the similar patterns within a group based on a conversion map which indicates how a match with respect to the representative pattern should be converted in order to obtain a match with respect to the similar patterns within the group to which the representative pattern belongs.

A further object of the present invention is to provide a computer-readable storage medium which stores a program for causing a computer to automatically convert a logic circuit which does not depend on a specific circuit technology into a circuit which uses a specific cell library, comprising optimizing means for causing the computer to optimize a pattern which is to be subjected to a matching process based on an inclusion relationship of structures of patterns with respect to each cell. According to the present invention, it is possible to carry out the matching process efficiently with respect to the cell library which has the tendency of becoming large scale and complex.

The optimizing means may cause the computer to omit the matching process with respect to a pattern which includes a pattern for which no match is obtained.

The optimizing means may cause the computer to define similar patterns which only differ by inverters provided at input and output sides thereof, and to determine one representative pattern with respect to each group of the similar patterns, and the computer-readable storage medium may further comprise matching means for causing the computer to carry out the matching process only with respect to the representative pattern.

The matching means may cause the computer to obtain a match with respect to the similar patterns within a group based on a conversion map which indicates how a match with respect to the representative pattern should be converted in order to obtain a match with respect to the similar patterns within the group to which the representative pattern belongs.

Other objects and further features of the present invention will be apparent from the following detailed description when read in conjunction with the accompanying drawings.

BRIEF DESCRIPTION OF THE DRAWING

FIG. 1 is a diagram showing an example of cells of a cell library and decomposition patterns of the cells;

FIG. 15 is a diagram showing an embodiment of conversion maps of similar patterns;

FIG. 16 is a diagram showing an embodiment of an inclusion relationship table;

FIG. 17 is a diagram for explaining a case where a pattern matching is checked with respect to an initial circuit; and FIG. 18 is a diagram showing experimental results of a matching process.

DESCRIPTION OF THE PREFERRED EMBODIMENT

BEST MODE OF CARRYING OUT THE INVENTION

In order to avoid the calculation time from increasing with respect to an increase in the number of patterns with respect to each cell, the present invention uses a process which simultaneously carries out a matching with respect to similar patterns and a process which optimizes patterns to be subjected to the matching by taking into consideration an inclusion relationship of structures of the patterns, so as to reduce the number of times the matching process is carried out.

First, a description will be given of the simultaneous matching of the similar patterns. In this specification, the similar patterns refer to patterns which only differ by an inverter which is provided or not provided at an input side and an output side of the patterns. For example, the cell NAND2 shown in FIG. 1(b) and the cells AND2, NOR2 and OR2 shown in FIGS. 1(h), 2(a) and 2(g) are similar patterns. Because the similar patterns only differ by an inverter which is provided or not provided at the input side and the output side of the patterns, results of matching the similar patterns only differ by an inverter which is provided or not provided at a boundary portion.

When the inverter chain heuristic technique described above is used, at least one inverter is always included before and after the boundary portion of the matching patterns in all cases. Hence, if one match is obtained with respect to one of the similar patterns, a match is always obtained with respect to the remaining similar patterns.

Figure 9:
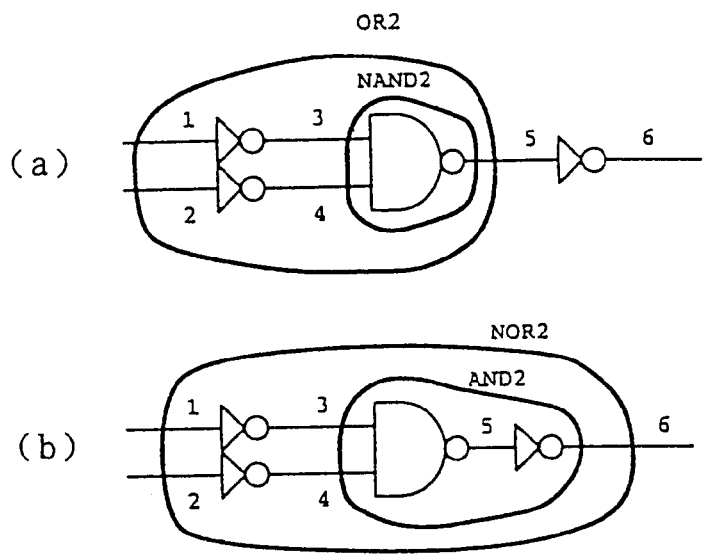
FIG. 9 is a diagram showing a match with respect to a cell NAND2 and a match with respect to a similar pattern.

FIG. 9 is a diagram showing a match with respect to the cell NAND2 and a match with respect to a similar pattern. In FIG. 9(a), the similar pattern is made up of the cell OR2 and one inverter provided at the output side of the cell OR2. Further, in FIG. 9(b), the similar pattern is made up of the cell NOR2 or, made up of the cell AND2 and two inverters provided at the input side.

Accordingly, the match respect to the similar patterns can be obtained by including or removing the inverter at the boundary portion of the matching patterns with respect to the original pattern, and the matching process can be carried out more efficiently compared to the case where the matching process is carried out independently for each of the patterns. In order to carry out the matching process with respect to the similar patterns, one representative pattern is determined from the similar patterns, and a conversion map with respect to the representative pattern is prepared for each of the remaining similar patterns other than the representative pattern. The conversion map indicates how the matching pattern with respect to the representative pattern should be converted in order to obtain the matching pattern with respect to each of the similar patterns. For example, if the cell NAND2 is defined as the representative pattern among the similar patterns of the cells NAND2, AND2, NOR2 and OR2, the conversion maps with respect to the remaining similar patterns become {a→a, b→b, f→*f} for the remaining pattern of the cell AND2, {a→*a, b→*b, f *f} for the remaining pattern of the cell NOR2, and {a→*a, b→*b, f→f} for the remaining pattern of the cell OR2, where "*" denotes an inversion.

In the case of the matching shown in FIG. 9, the match with respect to the pattern of the cell NAND2 is a=3, b=4 and f=5, and thus, by combining the conversion map {a→a, b→b, f→*f} for the pattern of the cell AND2, it is possible to obtain the match of a=3, b=4 and f=6 with respect to the pattern of the cell AND2 by changing the portion "5" corresponding to "f" to "6" which denotes an inversion thereof.

Figure 10:
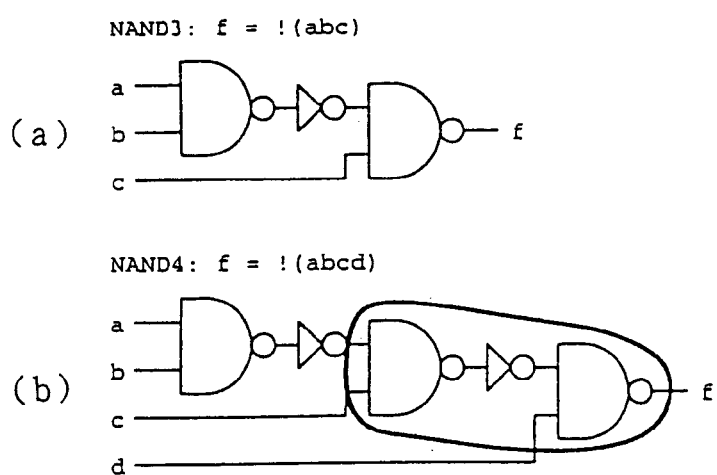
FIG. 10 is a diagram for explaining a pattern optimization using an inclusion relationship of patterns.

Next, a description will be given of the optimization of the pattern using the inclusion relationship of the patterns. In the patterns shown in FIGS. 1 and 10, the pattern of the cell NAND3 shown in FIGS. 1(c) and 10(a) appears at an output portion of the pattern of the cell NAND4 shown in FIGS. 1(d) and 10(b). In FIG. 10(b), the output portion of the pattern of the cell NAND4 where the pattern of the cell NAND3 appears is surrounded by bold solid line. In this specification, a pattern which includes the output portion of another pattern and forms a partial pattern, is referred to as an included pattern. If no match exists with respect to the included pattern, no match exists with respect to an including pattern which includes the included pattern.

Accordingly, this relationship of the included pattern and the including pattern is used to judge that a match with respect to a pattern including an arbitrary pattern does not exist if a match with respect to this arbitrary pattern does not exist. Consequently, it is possible to effectively reduce the number of times the matching process is carried out, by not testing the match with respect to the patterns which include this arbitrary pattern. In order to carry out such an operation, an inclusion relationship graph is created. The inclusion relationship graph includes a node corresponding to each pattern, and a branch of a node direction included between the node which are in the inclusion relationship to each other.

Figure 2:
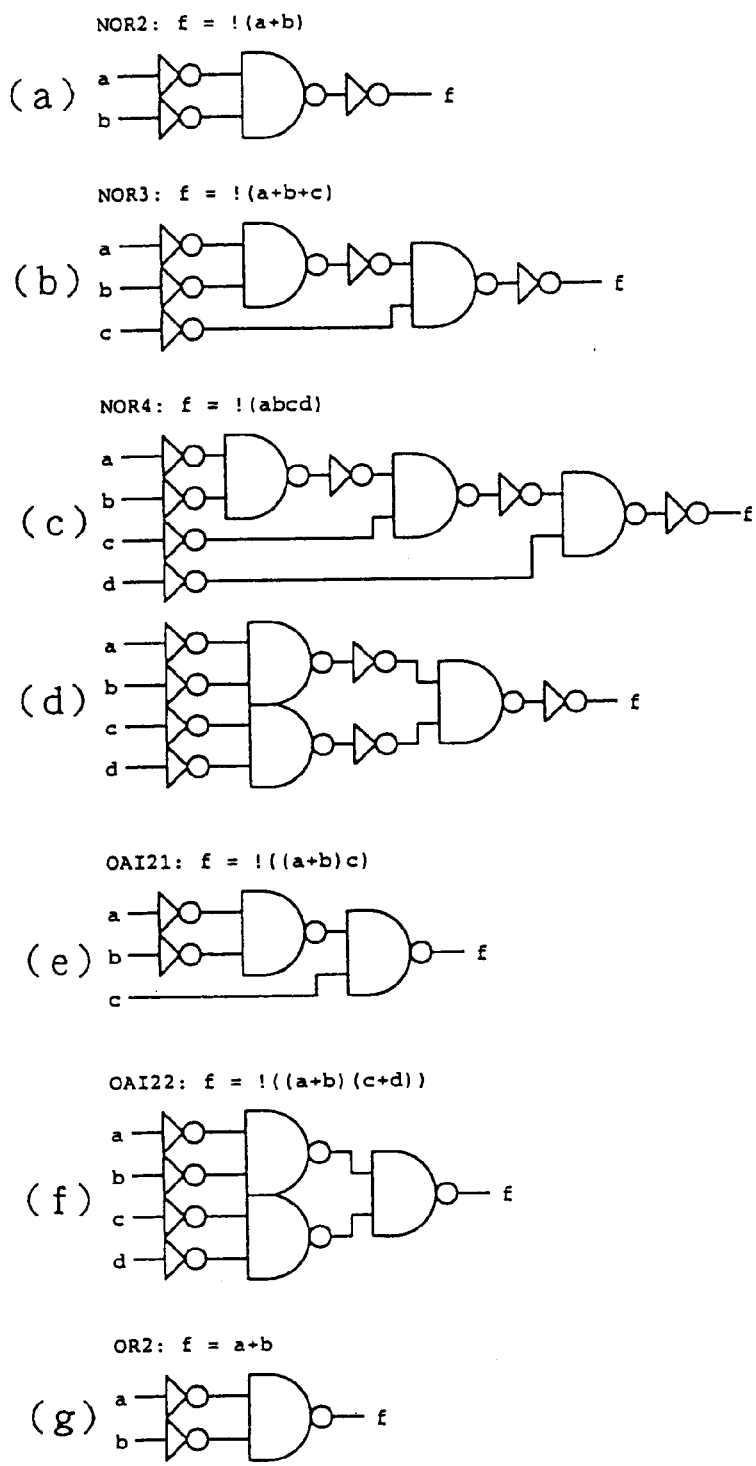
FIG. 2 is a diagram showing an example of cells of the cell library and the decomposition patterns of the cells.
Figure 3:
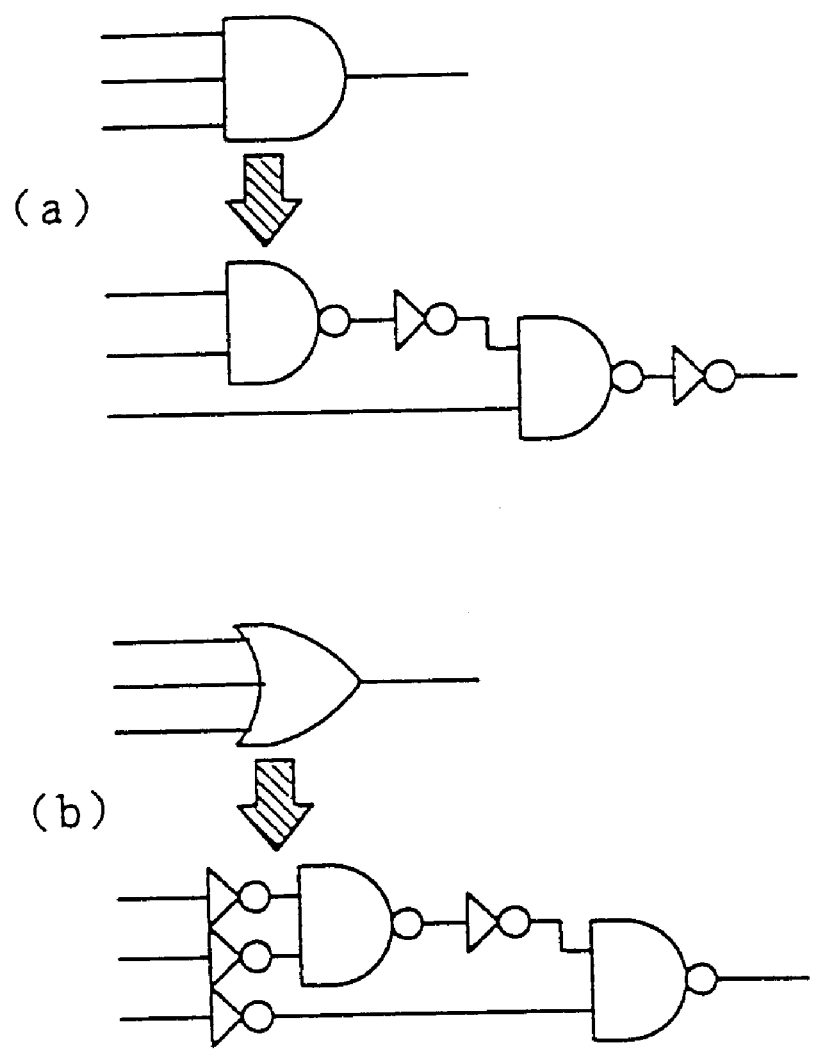
FIG. 3 is a diagram for explaining decomposition of an AND gate and an OR gate.
Figure 4:
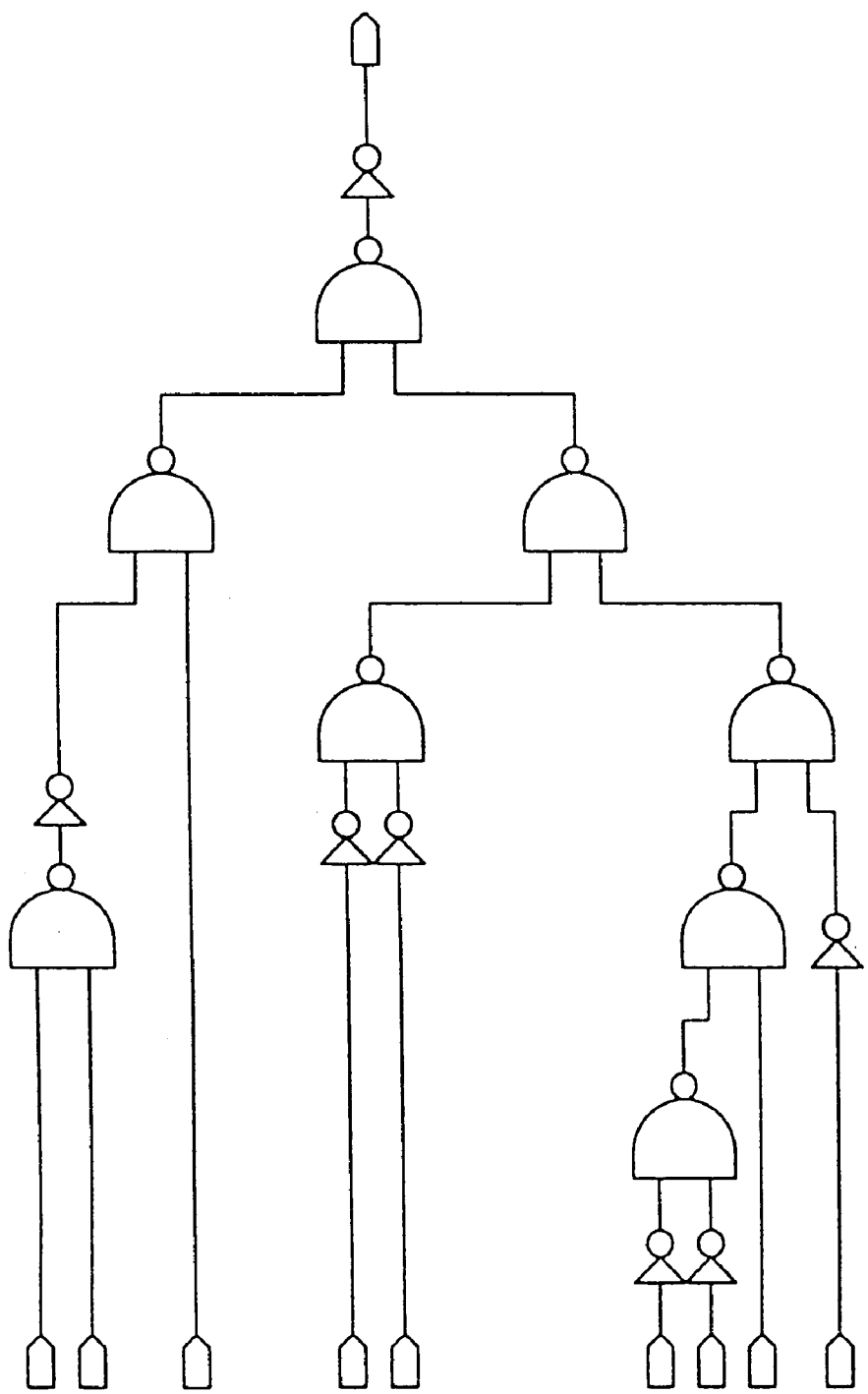
FIG. 4 is a diagram showing an example of a decomposed initial circuit.
Figure 5:
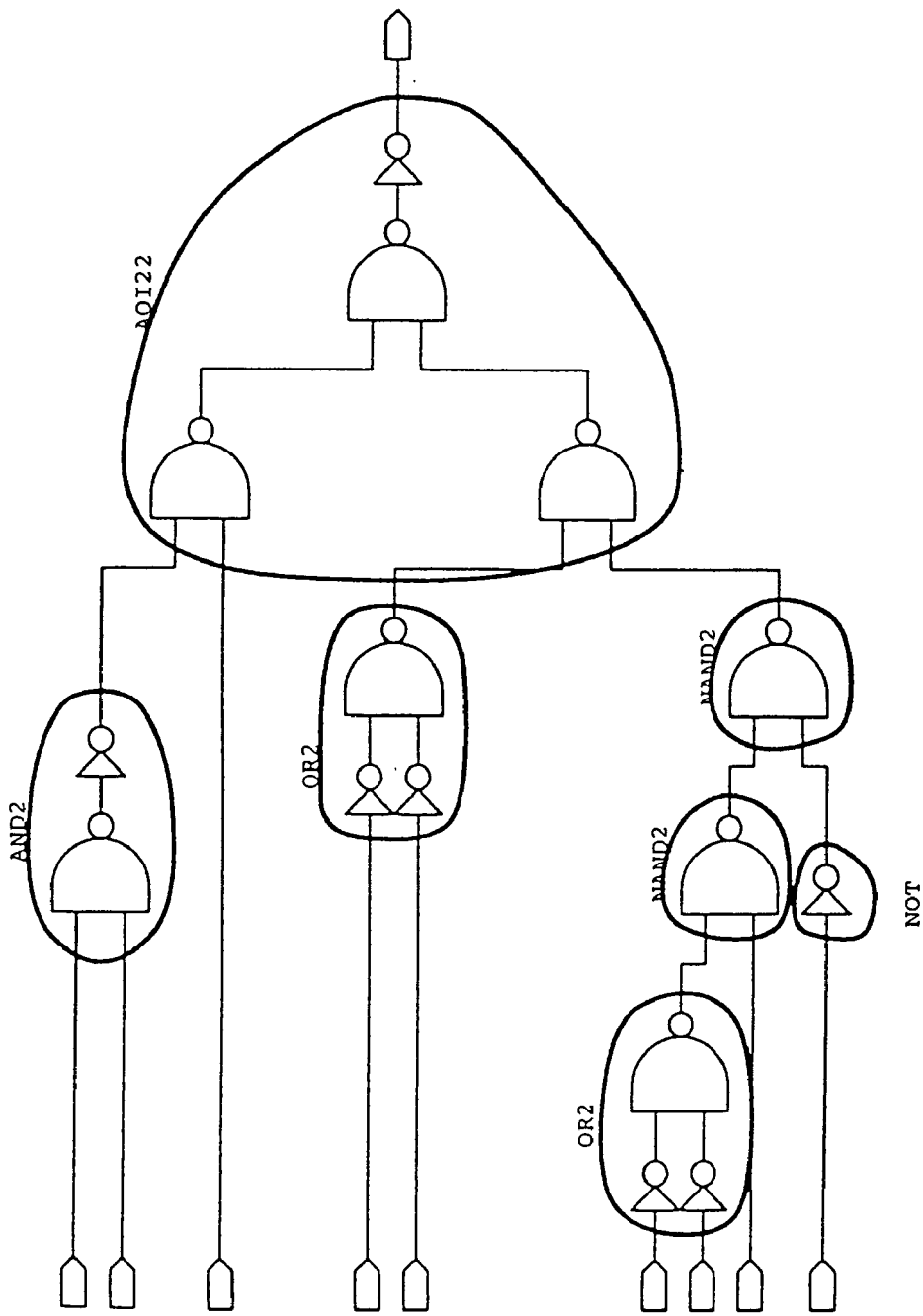
FIG. 5 is a diagram for explaining an example of an assignment of partial circuits with respect to the initial circuit shown in FIG. 4.
Figure 6:
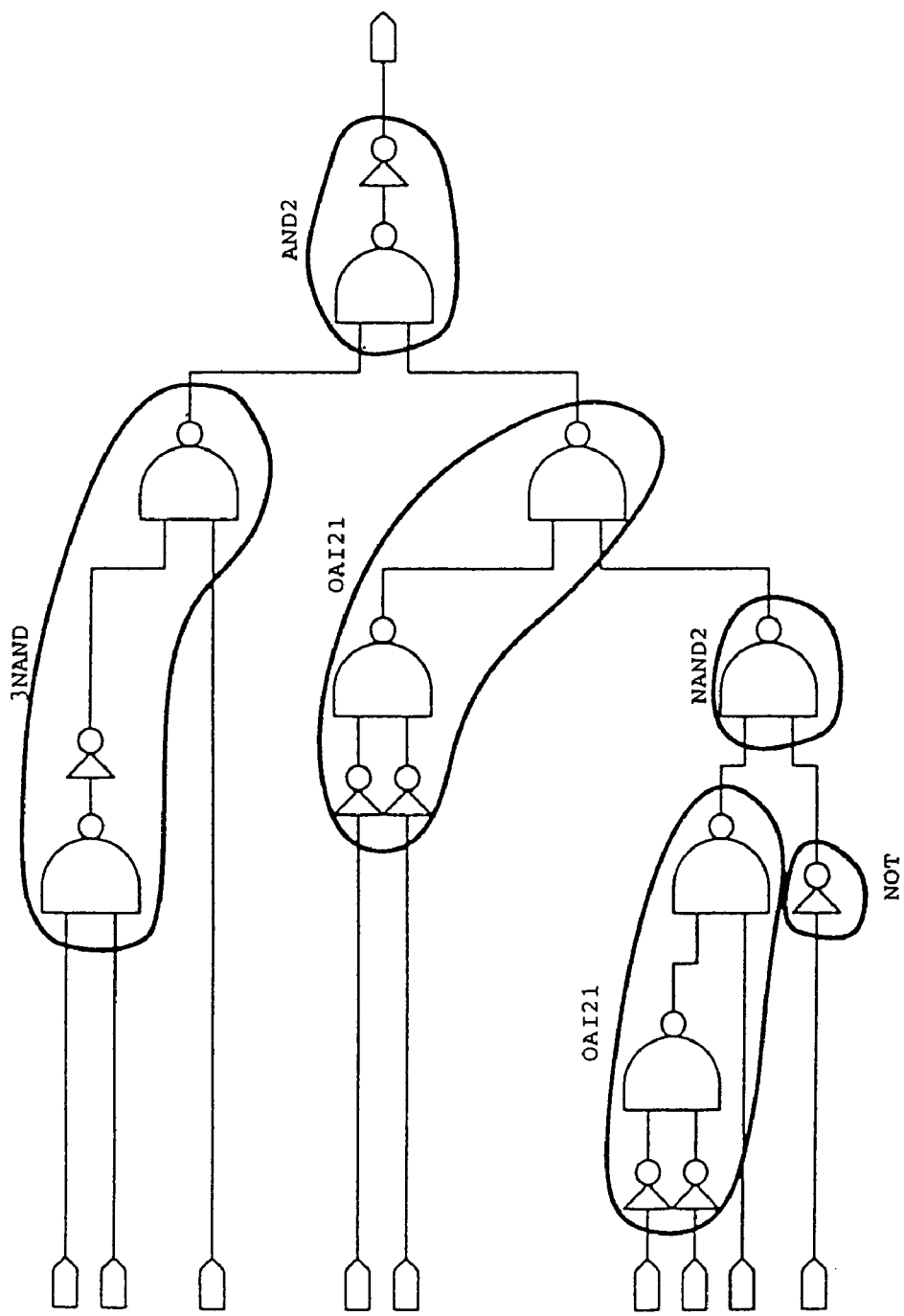
FIG. 6 is a diagram for explaining an example of the assignment of the partial circuits with respect to the initial circuit shown in FIG. 4.
Figure 7:
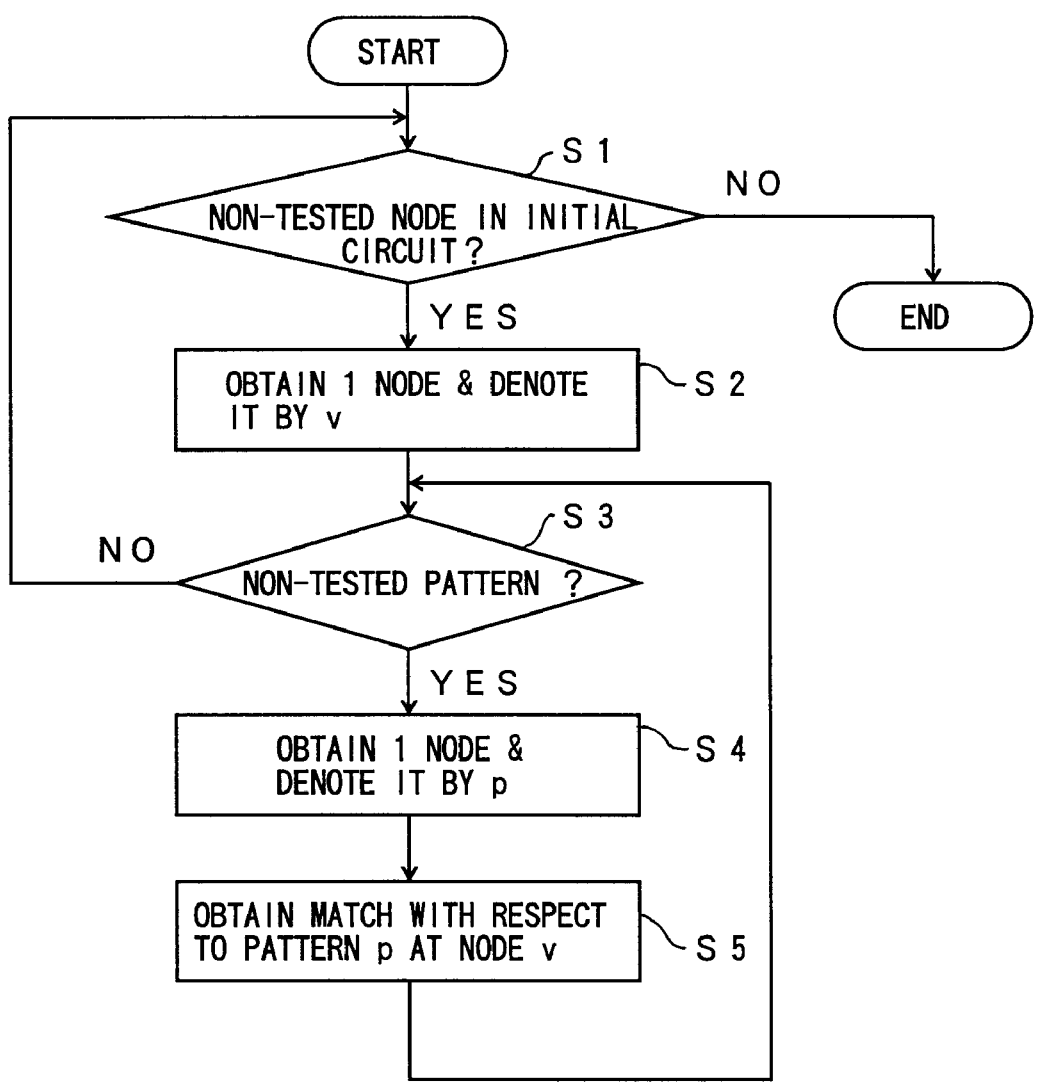
FIG. 7 is a flow chart showing a typical matching process.
Figure 8:
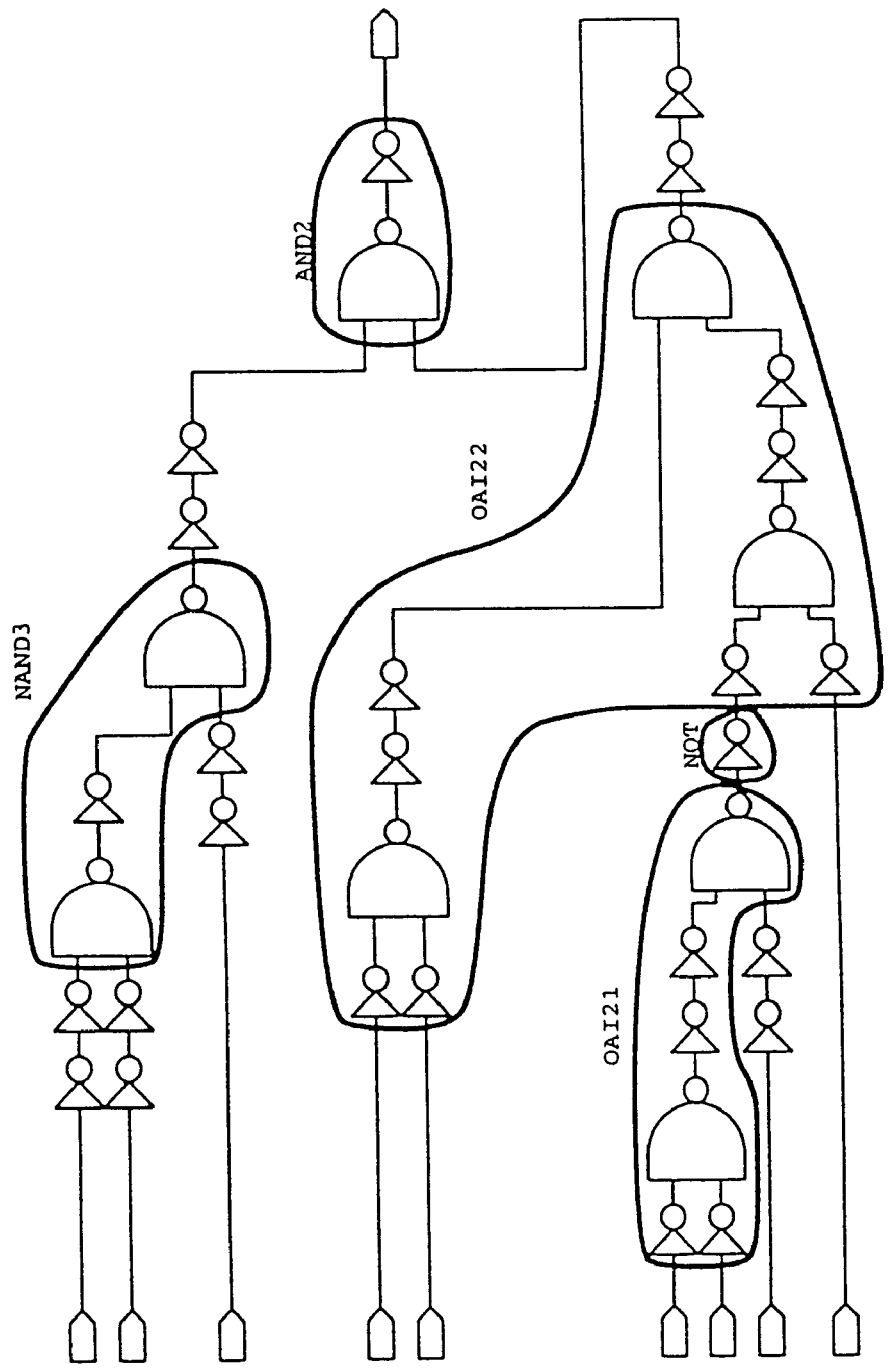
FIG. 8 is a diagram for explaining a case where a match is found using an inverter chain heuristic technique.
Figure 11:
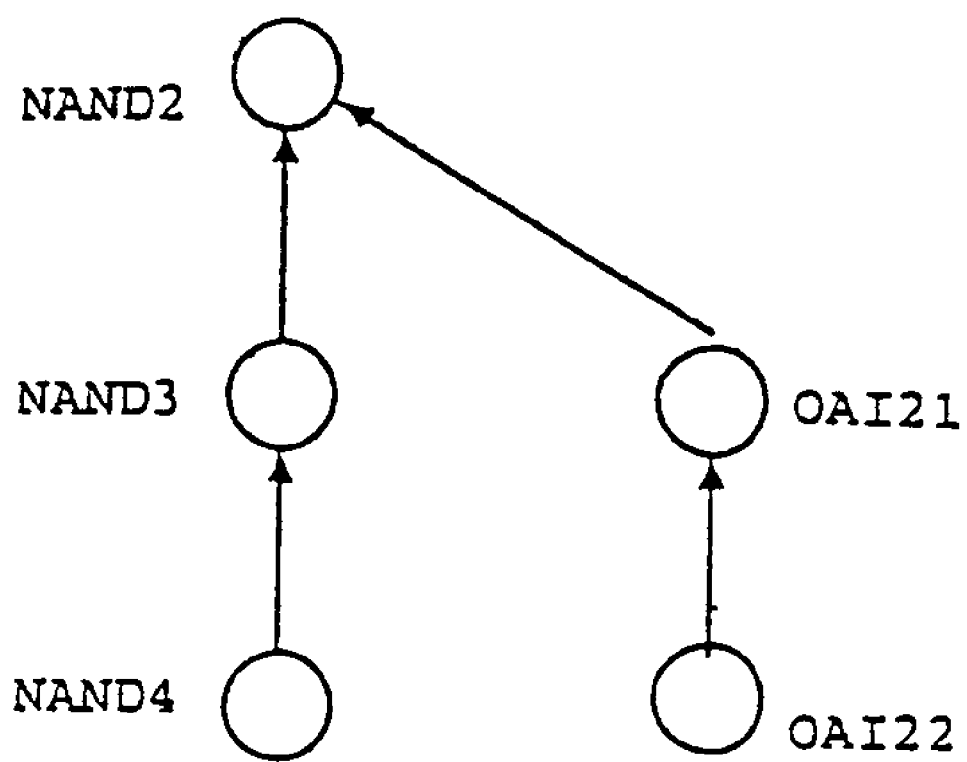
FIG. 11 is a diagram showing a portion of an inclusion relationship graph of cells shown in FIGS. 1 and 2.

FIG. 11 is a diagram showing a portion of an inclusion relationship graph of the cells shown in FIGS. 1 and 2. In FIG. 11, a circular mark indicates a node, and an arrow indicates a branch. When carrying out the matching process, a mark is added with respect to all of the nodes of this inclusion relationship graph, and the mark is erased when a match is obtained for the corresponding node. Hence, if a mark remains added to a predetermined node which is pointed by and thus included by a certain node, it is indicated that no match exists with respect to the pattern of this predetermined node or, no matching process has yet been carried out with respect to this predetermined node. Therefore, by defining a rule such that no matching process is carried out with respect to a pattern corresponding to a node which is added with the mark, the matching process will not be carried out with respect to a pattern which includes the pattern for which no match exists, thereby making it is possible to carry out the matching process at a high speed.

Next, a description will be given of an embodiment of the present invention, by referring to FIG. 12 and the subsequent drawings.

Figure 12:
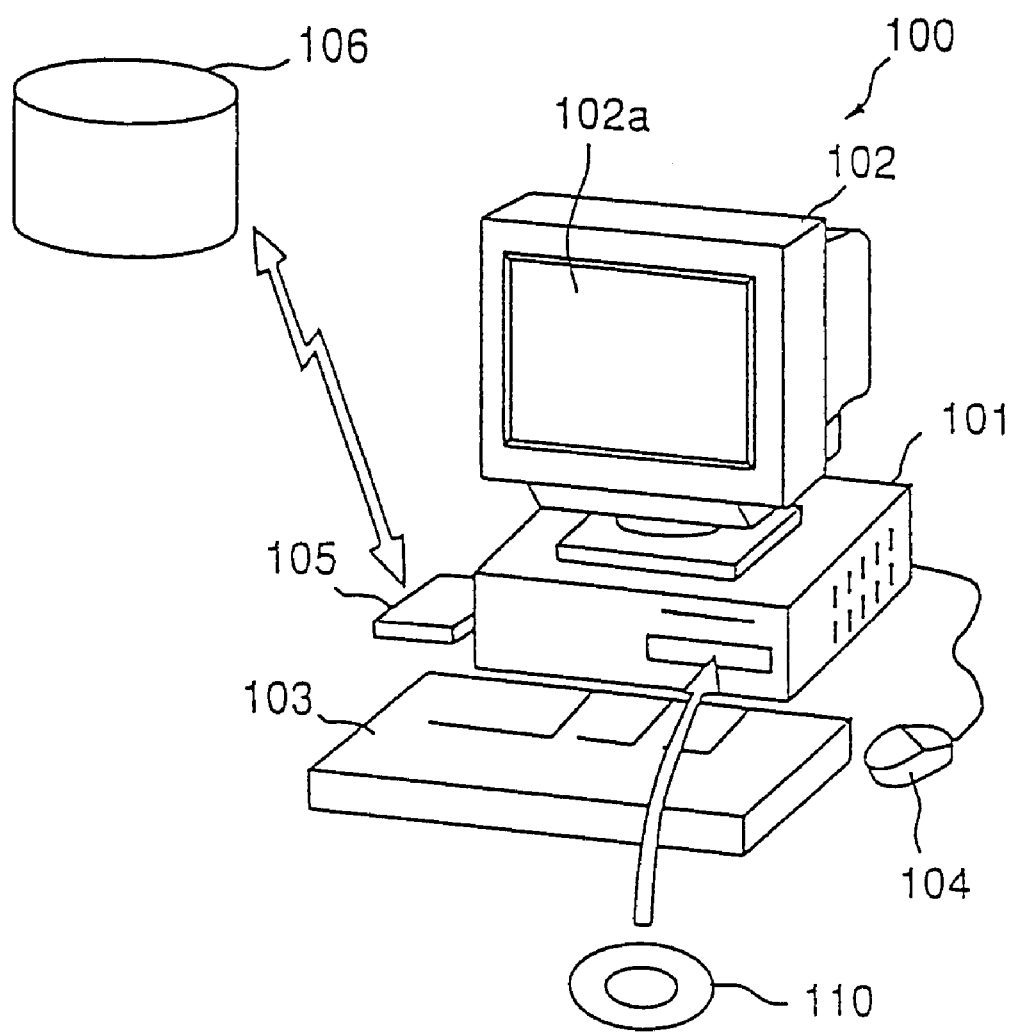
FIG. 12 is a perspective view showing a computer system which realizes an embodiment of a technology mapping method according to the present invention.

FIG. 12 is a perspective view showing a computer system which realizes the embodiment of the technology mapping method according to the present invention. The computer system shown in FIG. 12 is formed by a general computer system such as a personal computer.

A computer system 100 shown in FIG. 12 is provided with a main body 101 which includes a CPU, a disk drive and the like, a display 102 having a display screen 102a for displaying an image in response to an instruction from the main body 101, a keyboard 102 which is used to input various information to the computer system 100, a mouse 104 which is used to specify an arbitrary position on the display screen 102a of the display 102, and a modem 105 which is used to access an external database or the like to download a program or the like stored in another computer system. A program which is stored in a portable recording medium such as a disk 110 or, downloaded from a recording medium 106 of another computer system using a communication unit such as the modem 105, is input to and compiled in the computer system 100. This program includes a program for causing the CPU of the computer system 100 to process data by this embodiment of the technology mapping method.

An embodiment of a computer-readable storage medium according to the present invention is formed by a computer-readable recording medium such as the disk 110 which stores the program described above. The recording medium is not limited to a removable recording medium such as IC card memories, floppy disks, magneto-optical disks, CD-ROMs and various kinds of semiconductor memory devices, and also includes recording media accessible by a computer system which is connected via a communication means or a communication unit such as the modem and LAN.

Figure 13:
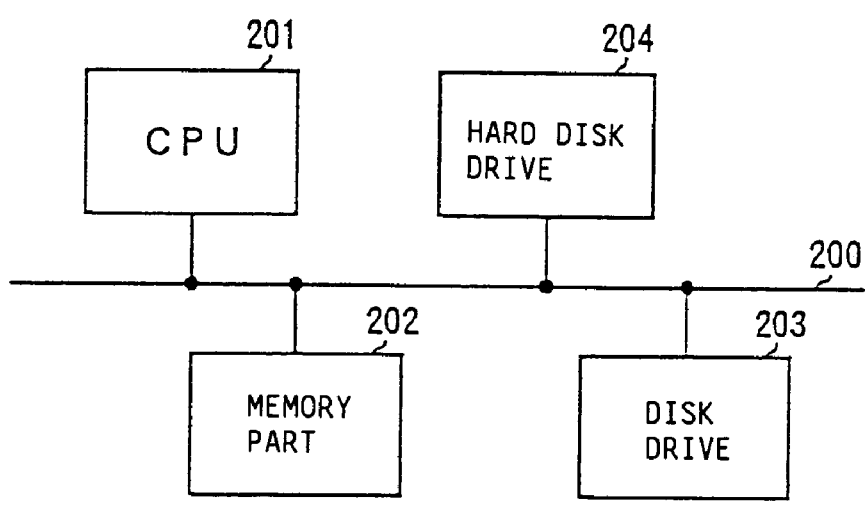
FIG. 13 is a system block diagram showing a construction of an important part within a main body of the computer system.

FIG. 13 is a system block diagram showing a construction of an important part within the main body 101 of the computer system 100. In FIG. 13, the main body 101 generally includes a CPU 201, a memory part 202 which is made of a RAM, ROM and the like, a disk drive 203 for the disk 110, and a hard disk drive 204 which are connected via a bus 200.

The construction of the computer system 100 is not limited to that shown in FIGS. 12 and 13, and it is of course possible to use various kinds of known constructions instead.

Figure 14:
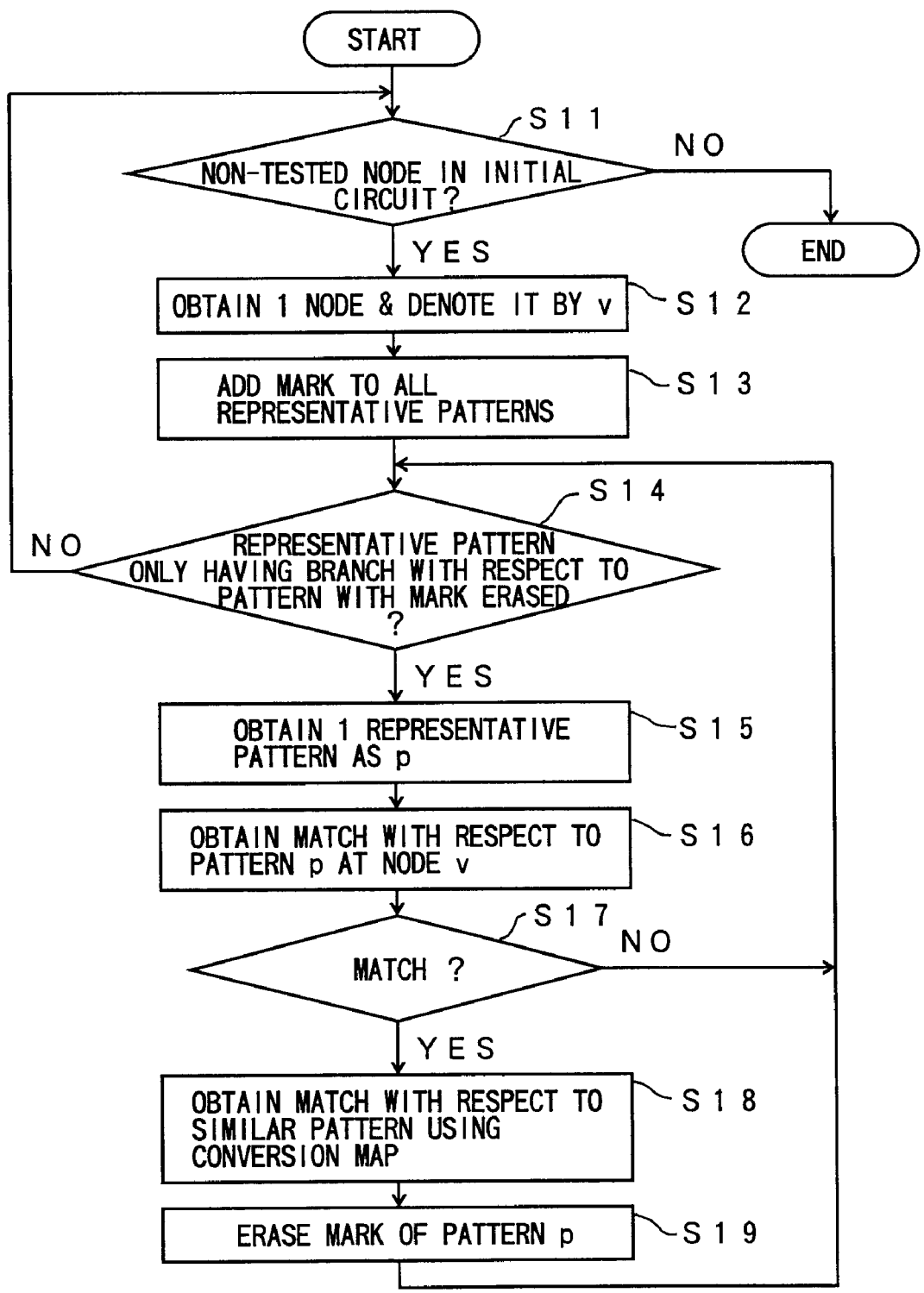
FIG. 14 is a flow chart for explaining a technology mapping process of a CPU employing the embodiment of the technology mapping method.

FIG. 14 is a flow chart for explaining a technology mapping process of the CPU 201 which employs this embodiment of the technology mapping method. The embodiment of the storage medium is formed by a recording medium such as the disk 110 which stores a program for causing the CPU 201 to carry out the technology mapping process shown in FIG. 14.

In FIG. 14, a step S11 decides whether or not a non-tested node exists on the inclusion relationship graph of the initial circuit, and the process ends if the decision result in the step S11 is NO. On the other hand, if the decision result in the step S11 is YES, a step S12 obtains a node from the inclusion relationship graph and denotes this node by v. A step S13 adds a mark to all representative patterns. A step S14 decides whether or not the inclusion relationship graph has a branch and there exists a representative pattern only having a branch with respect to a pattern which has the mark thereof erased. If the decision result in the step S14 is NO, the process returns to the step S11.

If the decision result in the step S14 is YES, a step S15 obtains one representative pattern only having the branch with respect to the pattern which has the mark thereof erased and denotes this representative pattern by p. A step S16 obtains a match with respect to the pattern p at the node v, and a step S17 decides whether or not a match exists. The process returns to the step S14 if the decision result in the step S17 is NO. On the other hand, if the decision result in the step S17 is YES, a step S18 obtains a match with respect to each similar pattern using the conversion map. A step S19 erases the mark added to the pattern p, and the process returns to the step S14.

Next, a description will be given of a data structure which is used for a case where this embodiment is applied to the patterns of the cell library shown in FIGS. 1 and 2.

First, the individual patterns are categorized into groups of similar patterns so that in each group, the similar patterns would match if the input or output were inverted. In this particular case, the individual patterns are categorized into the following five groups of similar patterns.

{NAND2, NOR2, AND2, OR2}
{NAND3, NOR3}
{NAND4, NOR4}
{OAI21, AOI21}
{OAI22, AOI22}

In each of the groups of similar patterns described above, the pattern which is listed first within the group is regarded as the representative pattern. For example, in the case of the group {NAND2, NOR2, AND2, OR2}, the first pattern NAND2 is regarded as the representative pattern of this group. In addition, with respect to each of the remaining patterns other than the representative pattern within each group, a conversion map is created. This conversion map of each similar pattern is recorded with a representative pattern name and a procedure for converting the similar pattern into the representative pattern. FIG. 15 is a diagram showing an embodiment of the conversion maps of the similar patterns.

Next, the inclusion relationship is checked with respect to each representative pattern, so as to obtain including pattern and included patterns, and an inclusion relationship table indicating the inclusion relationships of the representative patterns is created. FIG. 16 is a diagram showing an embodiment of the inclusion relationship table.

In the technology mapping process shown in FIG. 14, the conversion maps of the similar patterns shown in FIG. 15 and the inclusion relationship table shown in FIG. 16 are used when obtaining the match in the step S18.

When testing the match of all of the patterns shown in FIGS. 1 and 2 with respect to the initial circuit shown in FIG. 17(a), the conventional matching process would require the matching to be successively be carried out with respect to all of the patterns for all of the nodes 1, 2, 3, . . . of the initial circuit. Since the initial circuit shown in FIG. 17(a) has twelve nodes and fourteen patterns, it would be necessary to carry out the pattern matching a total of 168 times according to the conventional pattern matching process. On the other hand, according to this embodiment, it is possible to obtain the same matching result as the conventional matching process by carrying out the pattern matching a number of times which is much smaller than the conventional case, because the technology mapping process shown in FIG. 14 is carried.

For the sake of convenience, a description will now be given of a case where the pattern matching is carried out with respect to the initial circuit shown in FIG. 17(a) in this embodiment employing the technology mapping process shown in FIG. 14.

First, the match with respect to the node 1 of the initial circuit is obtained.

The mark is added to each of the representative patterns NAND2, NAND3, NAND4, OAI21 and OAI22 (step S13).

A judgement is made to determine whether or not there exists a representative pattern having no including pattern, that is, having a branch in the inclusion relationship graph, and only having a branch with respect to a pattern which has the mark thereof erased (step S14).

In this case, the pattern NAND2 corresponds to the representative pattern having the branch in the inclusion relationship graph and only having the branch with respect to the pattern which has the mark thereof erased (step S15).

A match of the pattern NAND2 with respect to the node 1 is obtained, but no match exists (step S17).

In this case, the matching process with respect to the node 1 ends because there is no other pattern corresponding to the representative pattern other than the pattern NAND2.

Next, the match with respect to the node 2 of the initial circuit is obtained.

The mark is added to each of the representative patterns NAND2, NAND3, NAND4, AOI21 and AOI22 (step S13).

A judgement is made to determine whether or not there exists a representative pattern having no including pattern, that is, having a branch in the inclusion relationship graph, and only having a branch with respect to a pattern which has the mark thereof erased (step S14).

In this case, the pattern NAND2 corresponds to the representative pattern having the branch in the inclusion relationship graph and only having the branch with respect to the pattern which has the mark thereof erased (step S15).

A match of the pattern NAND2 with respect to the node 2 is obtained, and the match exists (step S17). In other words, the nodes 2 and f2, the nodes 3 and a1, and the nodes 14 and b1 match.

A match with respect to a similar pattern of the pattern NAND2 is generated using the conversion map (step S18). More particularly, a match of the pattern NOR2 is obtained, and since all of the nodes a1, b1 and f1 are negated, the original matches are converted into new matches by including inverters. As a result, the nodes 1 and f1, the nodes 4 and a1, and the nodes 15 and b1 become the new matches. Similarly, a match with respect to the pattern AND2 is generated, and the nodes 1 and f1, the nodes 3 and a1, and the nodes 14 and b1 become the new matches. Furthermore, a match with respect to the pattern OR2 is generated, and the nodes 2 and f1, the nodes 4 and a1, and the nodes 15 and b1 become the new matches.

The mark added to the pattern NAND2 is erased (step S19).

Since the mark added to the pattern NAND2 is erased, the patterns OAI21 and NAND3 which include only the pattern NAND2 become the patterns to be subjected to the matching process (step S14).

First, the pattern NAND3 is obtained (step S15), and a match of the pattern NAND3 is obtained with respect to the node 2 (step S16). In this case, no match of the pattern NAND3 exists with respect to the node 3 (step S17).

Next, the pattern OAI21 is obtained (step S15), and a match of the pattern OAI21 is obtained with respect to the node 2 (step S16). In this case, a match of the pattern OAI21 with respect to the node 2 exists. In the pattern OAI21 shown in FIG. 2(e), the illustration of an internal inverter chain is omitted, but the internal inverter chain actually provided as shown in FIG. 17(b). In FIG. 17(b), a1 through h1 denote nodes and are also used as input/output signal names. Accordingly, a match of the nodes 7 and a1, the nodes 11 and b1, the nodes 14 and c1, the nodes 2 and f1, and a match of the nodes 18 and a1, the nodes 20 and b1, the nodes 3 and c1, and the nodes 2 and f1 are obtained (step S17).

Next, a match with respect to a similar pattern of the pattern OAI21 is obtained (step S18). More particularly, because all polarities should be judged for the pattern AOI21, a match of the nodes 6 and a1, the nodes 10 and b1, the nodes 14 and c1, and the nodes 1 and f1, and a match of the nodes 17 and a1, the nodes 19 and b1, the nodes 4 and c1, and the nodes 1 and f1 are obtained.

The mark added to the pattern OAI21 is erased (step S19).

When the mark added to the pattern OAI21 is erased, the pattern OAI22 then becomes the pattern to be subjected to the matching process.

A match of the pattern OAI22 is obtained with respect to the node 2 (step S16). In this case, a match of the nodes 7 and a1, the nodes 11 and b1, the nodes 18 and c1, the nodes 20 and d1, and the nodes 2 and f1 is obtained. A match of the nodes 18 and a1, the nodes 20 and b1, the nodes 7 and c1, the nodes 11 and d1, and the nodes 2 and f1 also exists, but this match is omitted since the two are the same match.

Next, a match with respect to a similar pattern of the pattern AOI22 is obtained (step S18). More particularly, because all polarities should be judged for the pattern AOI22, a match of the nodes 6 and a1, the nodes 10 and b1, the nodes 17 and c1, the nodes 19 and d1, and the nodes 1 and f1 is obtained.

The mark added to the pattern OAI22 is erased (step S19).

When the mark added to the pattern OAI22 is erased, there exists no more pattern which is to be subjected to the matching process, and the matching process with respect to the node 2 ends.

The technology mapping process progresses in this manner, and in the case of the node 2, the pattern NAND3 does not match, and the match of the pattern NAND4 is not tested. Similarly, in the case of the match with respect to the node 5, the pattern OAI21 does not match, and the match of the pattern OAI22 is not tested. Therefore, this embodiment judges the possibility that a match will be obtained, before carrying out the matching process, so as to avoid an unnecessary matching process.

The present inventor conducted experiments using this embodiment and the conventional matching process with respect to four kinds of cell libraries, so as to carry out the matching process with respect to a logic circuit having 10990 gates in a state where the logic circuit is decomposed into 2-input NAND nodes. From these experiments, experimental results shown in FIG. 18 were obtained.

As in the case of cell libraries A through D shown in FIG. 18, although a ratio of the number of patterns and the number of representative patterns differs depending on the cell library, it was confirmed that this embodiment can reduce the processing time of the matching process by several times to fifteen times that of the conventional matching process. In addition, it was also confirmed that this tendency of the processing time of the matching process according to this embodiment to reduce becomes more conspicuous as the number of patterns of the cell library increases, thereby confirming that the present invention is extremely effective with respect to an extremely large-scale cell library.

Further, the present invention is not limited to these embodiments, but various variations and modifications may be made without departing from the scope of the present invention.

What is claimed is:

1. A technology mapping method which automatically converts a logic circuit which does not depend on a specific circuit technology into a circuit which uses a specific cell library, using a computer, comprising:
    optimizing a pattern, which is to be subjected to a matching process, based on an inclusion relationship of structures of patterns with respect to each cell; and
    obtaining the inclusion relationship by using an inclusion relationship graph that includes a node corresponding to each pattern, and a branch of a node direction included between nodes which are in the inclusion relationship to each other.

2. The technology mapping method as claimed in claim 1, wherein said optimizing omits the matching process with respect to a pattern which includes a pattern for which no match is obtained.

3. The technology mapping method as claimed in claim 1, wherein said optimizing defines similar patterns which only differ by inverters provided at input and output sides thereof, and determines a representative pattern with respect to each group of the similar patterns, and further comprising:
    carrying out the matching process only with respect to the representative pattern.

4. The technology mapping method as claimed in claim 3, wherein said carrying out the matching process obtains a match with respect to similar patterns within a group based on a conversion map which indicates how a match with respect to the representative pattern should be converted in order to obtain a match with respect to the similar patterns within the group to which said representative pattern belongs.

5. A computer-readable storage medium which stores a program causing a computer to automatically convert a logic circuit which does not depend on a specific circuit technology into a circuit which uses a specific cell library, comprising:

optimizing means for causing the computer to optimize a pattern which is to be subjected to a matching process based on an inclusion relationship of structures of patterns with respect to each cell; and obtaining the inclusion relationship by using an inclusion relationship graph that includes a node corresponding to each pattern, and a branch of a node direction included between nodes which are in the inclusion relationship to each other.

6. The computer-readable storage medium as claimed in claim 5, wherein said optimizing means causes the computer to omit the matching process with respect to a pattern which includes a pattern for which no match is obtained.

7. The computer-readable storage medium as claimed in claim 5, wherein said optimizing means causes the computer to define similar patterns which only differ by inverters provided at input and output sides thereof, and to determine one representative pattern with respect to each group of the similar patterns, and further comprising:

matching means for causing the computer to carry out the matching process only with respect to the representative pattern.

8. The computer-readable storage medium as claimed in claim 7, wherein said matching means causes the computer to obtain a match with respect to the similar patterns within a group based on a conversion map which indicates how a match with respect to the representative pattern should be converted in order to obtain a match with respect to the similar patterns within the group to which said representative pattern belongs.

9. A computer-readable storage for controlling a computer to automatically convert a logic circuit, which is independent of specific circuit technology, into a circuit using a specific cell library, by:

optimizing a pattern which is to be subjected to a matching process based on an inclusion relationship of structures of patterns with respect to each cell; and obtaining the inclusion relationship by using an inclusion relationship graph that includes a node corresponding to each pattern, and a branch of a node direction included between nodes which are in the inclusion relationship to each other.

10. The computer-readable storage medium as claimed in claim 9, further comprising controlling the computer to convert the logic circuit into a circuit using a specific cell library, by:

omitting the matching process with respect to a pattern which includes a pattern for which no match is obtained.

11. The computer-readable storage medium as claimed in claim 9, further comprising controlling the computer to convert the logic circuit into a circuit using a specific cell library, by:

defining similar patterns which only differ by inverters provided at input and output sides thereof;

determining one representative pattern with respect to each group of the similar patterns; and carrying out the matching process only with respect to the representative pattern.

12. The computer-readable storage medium as claimed in claim 11, further comprising controlling the computer to convert the logic circuit into a circuit using a specific cell library, by:

obtaining a match with respect to the similar patterns within a group based on a conversion map which indicates how a match with respect to the representative pattern should be covered and thereby obtaining a match with respect to the similar patterns within the group to which said representative pattern belongs.

* * * * *